United States Patent
Wang et al.

(10) Patent No.: US 7,737,028 B2
(45) Date of Patent: Jun. 15, 2010

(54) SELECTIVE RUTHENIUM DEPOSITION ON COPPER MATERIALS

(75) Inventors: Rongjun Wang, Cupertino, CA (US); Hua Chung, San Jose, CA (US); Jick M. Yu, San Jose, CA (US); Praburam Gopalraja, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 61 days.

(21) Appl. No.: 12/240,822

(22) Filed: Sep. 29, 2008

(65) Prior Publication Data

US 2009/0087982 A1 Apr. 2, 2009

Related U.S. Application Data

(60) Provisional application No. 60/976,113, filed on Sep. 28, 2007.

(51) Int. Cl.
*H01L 21/4763* (2006.01)
*H01L 21/44* (2006.01)

(52) U.S. Cl. .......... 438/637; 438/643; 438/644; 438/650; 438/653; 438/675; 438/687; 257/E21.171; 257/E21.577; 257/E21.584; 257/E21.586

(58) Field of Classification Search .......... 438/637, 438/643, 644, 650, 653, 675, 687, E21.577, 438/E21.584, E21.586
See application file for complete search history.

(56) References Cited

U.S. PATENT DOCUMENTS

| | | | |
|---|---|---|---|
| 5,372,849 A | 12/1994 | McCormick et al. |
| 5,962,716 A | 10/1999 | Uhlenbrock et al. |
| 6,063,705 A | 5/2000 | Vaartstra |
| 6,074,945 A | 6/2000 | Vaartstra et al. |
| 6,114,557 A | 9/2000 | Uhlenbrock et al. |
| 6,338,991 B1 | 1/2002 | Zhang et al. |
| 6,365,502 B1 | 4/2002 | Paranjpe et al. |

(Continued)

FOREIGN PATENT DOCUMENTS

EP 1293509 A3 5/2004

(Continued)

OTHER PUBLICATIONS

Aaltonen "Atomic Layer Deposition of Noble Metal Thin Films," Academic Dissertation presented at the Department of Chemistry of the University of Helsinki on Apr. 8, 2005, Helsinki, Finland, pp. 1-71.
Aaltonen, et al. "Atomic Layer Deposition of Ruthenium from $RuCp_2$ and Oxygen: Film Growth and Reaction Mechanism Studies," Electrochemical Society Proceedings, vol. 2003-08, pp. 946-953.
Aaltonen, et al. "Atomic Layer Deposition of Ruthenium Thin Films from $Ru(thd)_3$ and Oxygen," Chem. Vap. Deposition (2004), 10, No. 4, pp. 215-219.

(Continued)

*Primary Examiner*—Walter L Lindsay, Jr.
*Assistant Examiner*—Ron Pompey
(74) *Attorney, Agent, or Firm*—Patterson & Sheridan

(57) ABSTRACT

Embodiments of the invention provide processes for selectively forming a ruthenium-containing film on a copper surface over exposed dielectric surfaces. Thereafter, a copper bulk layer may be deposited on the ruthenium-containing film. In one embodiment, a method for forming layers on a substrate is provided which includes positioning a substrate within a processing chamber, wherein the substrate contains a copper-containing surface and a dielectric surface, exposing the substrate to a ruthenium precursor to selectively form a ruthenium-containing film over the copper-containing surface while leaving exposed the dielectric surface, and depositing a copper bulk layer over the ruthenium-containing film.

21 Claims, 2 Drawing Sheets

U.S. PATENT DOCUMENTS

| | | |
|---|---|---|
| 6,423,619 B1 | 7/2002 | Grant et al. |
| 6,440,495 B1 | 8/2002 | Wade et al. |
| 6,462,367 B2 | 10/2002 | Marsh et al. |
| 6,479,100 B2 | 11/2002 | Jin et al. |
| 6,482,740 B2 | 11/2002 | Soininen et al. |
| 6,498,091 B1 | 12/2002 | Chen et al. |
| 6,517,616 B2 | 2/2003 | Marsh et al. |
| 6,527,855 B2 | 3/2003 | DelaRosa et al. |
| 6,541,067 B1 | 4/2003 | Marsh et al. |
| 6,576,778 B1 | 6/2003 | Uhlenbrock et al. |
| 6,580,111 B2 | 6/2003 | Kim et al. |
| 6,596,602 B2 | 7/2003 | Iizuka et al. |
| 6,605,735 B2 | 8/2003 | Kawano et al. |
| 6,610,568 B2 | 8/2003 | Marsh et al. |
| 6,617,634 B2 | 9/2003 | Marsh et al. |
| 6,627,995 B2 | 9/2003 | Paranjpe et al. |
| 6,713,373 B1 | 3/2004 | Omstead |
| 6,737,317 B2 | 5/2004 | Marsh et al. |
| 6,743,739 B2 | 6/2004 | Shimamoto et al. |
| 6,744,138 B2 | 6/2004 | Marsh |
| 6,780,758 B1 | 8/2004 | Derderian et al. |
| 6,790,773 B1 | 9/2004 | Drewery et al. |
| 6,800,542 B2 | 10/2004 | Kim et al. |
| 6,800,937 B2 | 10/2004 | Marsh et al. |
| 6,824,816 B2 | 11/2004 | Aaltonen et al. |
| 6,861,356 B2 | 3/2005 | Matsuse et al. |
| 6,887,795 B2 | 5/2005 | Soininen et al. |
| 6,893,915 B2 | 5/2005 | Park et al. |
| 7,026,714 B2 * | 4/2006 | Cunningham ............... 257/751 |
| 7,264,846 B2 * | 9/2007 | Chang et al. ............. 427/248.1 |
| 7,265,048 B2 * | 9/2007 | Chung et al. ................ 438/628 |
| 7,404,985 B2 | 7/2008 | Chang et al. |
| 7,429,402 B2 | 9/2008 | Gandikota et al. |
| 7,446,032 B2 | 11/2008 | Kailasam |
| 7,473,634 B2 | 1/2009 | Suzuki |
| 7,476,618 B2 * | 1/2009 | Kilpela et al. ............... 438/686 |
| 2001/0006838 A1 | 7/2001 | Won et al. |
| 2001/0054730 A1 | 12/2001 | Kim et al. |
| 2002/0000587 A1 | 1/2002 | Kim et al. |
| 2002/0004293 A1 | 1/2002 | Soininen et al. |
| 2002/0025627 A1 | 2/2002 | Marsh et al. |
| 2002/0028556 A1 | 3/2002 | Marsh et al. |
| 2002/0074577 A1 | 6/2002 | Marsh et al. |
| 2002/0076881 A1 | 6/2002 | Marsh et al. |
| 2002/0081381 A1 | 6/2002 | DelaRosa et al. |
| 2002/0102810 A1 | 8/2002 | Iizuka et al. |
| 2002/0121697 A1 | 9/2002 | Marsh |
| 2002/0125516 A1 | 9/2002 | Marsh et al. |
| 2002/0173054 A1 | 11/2002 | Kim |
| 2002/0197856 A1 | 12/2002 | Matsuse et al. |
| 2003/0096468 A1 | 5/2003 | Soininen et al. |
| 2003/0165615 A1 | 9/2003 | Aaltonen et al. |
| 2003/0212285 A1 | 11/2003 | Uhlenbrock et al. |
| 2004/0005753 A1 | 1/2004 | Kostamo et al. |
| 2004/0038529 A1 | 2/2004 | Soininen et al. |
| 2004/0105934 A1 | 6/2004 | Chang et al. |
| 2004/0113279 A1 | 6/2004 | Chen et al. |
| 2004/0211665 A1 | 10/2004 | Yoon et al. |
| 2004/0214354 A1 | 10/2004 | Marsh et al. |
| 2004/0241321 A1 | 12/2004 | Ganguli et al. |
| 2004/0266167 A1 | 12/2004 | Dubin et al. |
| 2005/0006799 A1 | 1/2005 | Gregg et al. |
| 2005/0081882 A1 | 4/2005 | Greer et al. |
| 2005/0085031 A1 | 4/2005 | Lopatin et al. |
| 2005/0124154 A1 | 6/2005 | Park et al. |
| 2005/0238808 A1 | 10/2005 | Gatineau et al. |
| 2006/0019494 A1 | 1/2006 | Cao et al. |
| 2006/0033678 A1 * | 2/2006 | Lubomirsky et al. .......... 345/32 |
| 2006/0128150 A1 | 6/2006 | Gandikota et al. |
| 2006/0153973 A1 | 7/2006 | Chang et al. |
| 2006/0165892 A1 | 7/2006 | Weidman |
| 2006/0199372 A1 | 9/2006 | Chung et al. |
| 2006/0240187 A1 | 10/2006 | Weidman |
| 2006/0246699 A1 | 11/2006 | Weidman et al. |
| 2007/0004201 A1 | 1/2007 | Lubomirsky et al. |
| 2007/0054487 A1 | 3/2007 | Ma et al. |
| 2007/0077750 A1 | 4/2007 | Ma et al. |
| 2007/0099422 A1 | 5/2007 | Wijekoon et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |
| 2007/0235059 A1 | 10/2007 | Chu et al. |
| 2008/0135914 A1 | 6/2008 | Krishna et al. |
| 2008/0274279 A1 | 11/2008 | Chang et al. |
| 2009/0065939 A1 * | 3/2009 | Suzuki ....................... 257/751 |

FOREIGN PATENT DOCUMENTS

| | | |
|---|---|---|
| JP | 2001111000 | 4/2001 |
| JP | 2001237400 | 8/2001 |
| WO | WO-0188972 | 11/2001 |
| WO | WO-03056612 | 7/2003 |
| WO | WO-2005020317 | 3/2005 |

OTHER PUBLICATIONS

Aaltonen, et al. "Ruthenium Thin Films Grown by Atomic Layer Deposition," Chem. Vap. Deposition (2003), 9, No. 1, pp. 45-49.

Aoyama, et al. "Ruthenium Films Prepared by Liquid Source Chemical Vapor Deposition Using Bis-(ethylcyclopentadienyl)ruthenium," Jpn. J. Appl. Phys. vol. 38 (1999), pp. L1134-L1136.

Dadgar, et al. "Growth of Ru doped semi-insulating InP by low pressure metalorganic chemical vapor deposition," Journal of Crystal Growth 195 (1998), pp. 69-73.

Dadgar, et al. "Ruthenium: A superior compensator of InP," Applied Physics Letters, vol. 73, No. 26, Dec. 28, 1998, American Institute of Physics, pp. 3878-3880.

Dey, et al. "Ruthenium films by digital chemical vapor deposition: Selectivity, nanostructure, and work function," Applied Physics Letter, vol. 84, No. 9, Mar. 1, 2004, American Institute of Physics, pp. 1606-1608.

Goswami, et al. Transition Metals Show Promise as Copper Barriers, Semiconductor International, ATMI, San Jose—May 1, 2004.

Kwon, et al. "Atomic Layer Deposition of Ruthenium Thin Films for Copper Glue Layer," Journal of the Electrochemical Society, 151 (2) (2004), pp. G109-G112.

Kwon, et al. "PEALD of a Ruthenium Adhesion Layer for Copper Interconnects," Journal of the Electrochemical Society, 151 (12) (2004), pp. C753-C756.

Kwon, et al. "Plasma-Enhanced Atomic Layer Deposition of Ruthenium Thin Films," Electrochemical and Solid-State Letters, 7 (4) (2004), pp. C46-C48.

Lashdaf, et al. "Deposition of palladium and ruthenium β-diketonates on alumina and silica supports in gas and liquid phase," Applied Catalysis A: General 241 (2003), pp. 51-63.

Lim, et al. "Atomic layer deposition of transition metals," Nature Materials, vol. 2, (Nov. 2003), pp. 749-754.

Meda, et al. "Chemical Vapor Deposition of Ruthenium Dioxide Thin Films From Bis(2,4-dimethylpentadienyl)Ruthenium," Chemical Aspects of Electronic Ceramics Processing, Symposium Mater. Res. Soc., Warrendale, PA, USA, 1998, pp. 75-80, XP009050315, ISBN: 1-55899-400-9.

Shibutami, et al. "A Novel Ruthenium Precursor for MOCVD without Seed Ruthenium Layer," TOSOH Research & Technology Review, vol. 47 (2003), pp. 61-64.

Sun, et al. "Properties of Ru Thin Films Fabricated on TiN by Metal-Organic Chemical Vapor Deposition," Japanese Journal of Applied Physics, vol. 43, No. 4A, 2004, The Japan Society of Applied Physics, pp. 1566-1570.

* cited by examiner

SELECTIVE RUTHENIUM DEPOSITION ON COPPER MATERIALS

CROSS-REFERENCE TO RELATED APPLICATION

This application claims benefit of U.S. Ser. No. 60/976,113 (APPM/011881L), filed Sep. 28, 2007, which is herein incorporated by reference in its entirety.

BACKGROUND OF THE INVENTION

1. Field of the Invention

Embodiments of the invention generally relate to a metallization process for manufacturing semiconductor devices, and more particularly, to depositing ruthenium and copper materials on a substrate.

2. Description of the Related Art

Copper is the current metal of choice for use in multilevel metallization processes that are crucial to semiconductor and electronic device manufacturing. The multilevel interconnects that drive the manufacturing processes require planarization of high aspect ratio apertures including contacts, vias, lines, and other features. Filling the features without creating voids or deforming the feature geometry is more difficult when the features have higher aspect ratios. Reliable formation of interconnects is also more difficult as manufacturers strive to increase circuit density and quality.

As the use of copper has permeated the marketplace because of its relative low cost and processing properties, semiconductor manufacturers continue to look for ways to improve the boundary regions between copper and dielectric material by reducing copper diffusion and dewetting. Several processing methods have been developed to manufacture copper interconnects as feature sizes have decreased. Each processing method may increase the likelihood of errors such as copper diffusion across boundary regions, copper crystalline structure deformation, and dewetting. Physical vapor deposition (PVD), chemical vapor deposition (CVD), atomic layer deposition (ALD), electrochemical plating (ECP), and electroless deposition, are processes for depositing copper while chemical mechanical polishing (CMP) and electrochemical mechanical polishing (ECMP) are processes for removing copper. These processes utilize mechanical, electrical, and/or chemical techniques to manipulate the copper materials that form interconnects. Barrier and capping layers may be deposited to contain the copper material.

In the past, a layer of tantalum, tantalum nitride, or copper alloy with tin, aluminum, or magnesium was used to provide a barrier layer or an adhesion promoter between copper and other materials. These options are costly or only partially effective or both. As the copper atoms along the boundary regions experience changes in temperature, pressure, atmospheric conditions, or other process variables common during multiple step semiconductor processing, the copper may migrate along the boundary regions and become agglomerated copper. The copper may also be less uniformly dispersed along the boundary regions and become dewetted copper. These changes in the boundary region include stress migration and electromigration of the copper atoms. The stress migration and electromigration of copper across the dielectric layers or other structures increases the resistivity of the resulting structures and reduces the reliability of the resulting devices.

Barrier layers containing ruthenium have been deposited by PVD, CVD, and ALD processes. PVD processes for depositing ruthenium are often hard to control the precise thicknesses of the deposited material. CVD processes usually suffer from poor conformality and contaminants in the deposited ruthenium-containing film. During a typical ALD process, a ruthenium precursor and a reducing agent are sequentially exposed to a substrate to form the desired ruthenium-containing film. ALD processes have several advantages over other vapor deposition processes, such as very conformal films and the ability to deposit into high aspect ratio vias. However, the deposition rates of an ALD process are often too slow, so that ALD processes are not often used in commercial applications. Also, ruthenium is usually deposited across the overall substrate surface by ALD, regardless that the exposed substrate surface may have various types of materials.

Therefore, a need exists to enhance the stability and adhesion of copper-containing layers, especially for copper seed layers. Also, a need exists to improve the electromigration (EM) reliability of copper-containing layer, especially for copper line formations, while preventing the diffusion of copper into neighboring materials, such as dielectric materials. A further need exists for an improved vapor deposition process to deposit ruthenium materials.

SUMMARY OF THE INVENTION

Embodiments of the invention provide methods for selectively forming a ruthenium-containing film on a copper surface over exposed dielectric surfaces. Thereafter, a copper bulk layer may be deposited on the ruthenium-containing film. In one embodiment, a method for forming layers on a substrate is provided which includes positioning the substrate within a processing chamber, wherein the substrate contains a copper-containing surface and a dielectric surface, exposing the substrate to a ruthenium precursor to selectively form a ruthenium-containing film over the copper-containing surface while leaving exposed the dielectric surface, and depositing a copper bulk layer over the ruthenium-containing film. In one example, a copper seed layer may be deposited by a physical vapor deposition (PVD) process and the copper bulk layer may be deposited by an electrochemical plating (ECP) process.

In another embodiment, a method for forming layers on a substrate is provided which includes exposing the substrate to a ruthenium precursor containing an organic ligand to selectively form a ruthenium-containing film over the copper-containing surface while leaving exposed the dielectric surface. The ruthenium precursor reacts with the copper-containing surface to form copper-containing compounds containing the organic ligand. The method further provides removing the copper-containing compounds as a gas from the processing chamber and depositing a copper bulk layer over the ruthenium-containing film.

In various examples, the ruthenium-containing film may be deposited by a vapor deposition process while the substrate is heated to a temperature within a range from about 100° C. to about 400° C. In some examples, the ruthenium-containing film may have a thickness within a range from about 2 Å to about 20 Å. In other examples, the ruthenium-containing film may have a thickness of about 100 Å or less, preferably, about 20 Å or less, such as about 10 Å or less.

The ruthenium precursor used during the deposition process may contain at least one ligand that includes cyclopentadienyl, alkylcyclopentadienyl, pentadienyl, alkylpentadienyl, amindinate, carbonyl, pyrrolyl, oxide, derivatives thereof, or combinations thereof. Some exemplary ruthenium precursors include bis(cyclopentadienyl)ruthenium, bis(2,4-dimethylcyclopentadienyl)ruthenium, bis(2,4-diethylcyclopentadienyl)ruthenium, bis(methylethylcyclopentadienyl)

ruthenium, (methylcyclopentadienyl)(ethylcyclopentadienyl)ruthenium, bis(2,4-dimethylpentadienyl)ruthenium, bis(2,4-diethylpentadienyl)ruthenium, (2,4-dimethylpentadienyl)(cyclopentadienyl)ruthenium, (2,4-dimethylpentadienyl)(methylcyclopentadienyl)ruthenium, (2,4-dimethylpentadienyl)(ethylcyclopentadienyl)ruthenium, derivatives thereof, or combinations thereof.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide a method that utilizes a ruthenium-containing film to prevent copper diffusion and dewetting in interconnect boundary regions. The transition metal, for example, ruthenium, improves copper boundary region properties to promote adhesion, decrease diffusion and agglomeration, and encourage uniform roughness and wetting of the substrate surface during processing. Embodiments provide that a ruthenium-containing film may be deposited on a copper seed layer prior to bulk copper deposition in order to improve the dewetting of the copper seed layer.

Figure 1A:
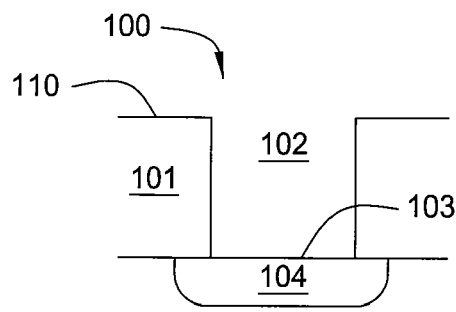
FIGS. 1A-1E depict schematic views of a substrate at different process steps according to an embodiment described herein.

FIGS. 1A-1E illustrate a ruthenium-containing film between a copper seed layer and a copper bulk layer. It is believed that the presence of a ruthenium-containing film has a minimal effect on resistivity and decreases the likelihood of copper dewetting. FIG. 1A illustrates substrate 100 with dielectric layer 101 having via 102 formed therein with base 103 that reveals metal feature 104 such as a copper-containing feature deposited below dielectric layer 101. In one example, metal feature 104 contains copper or a copper alloy and has a copper-containing surface. Dielectric surface 110 of dielectric layer 101 extends across the field of substrate 100.

Figure 1B:
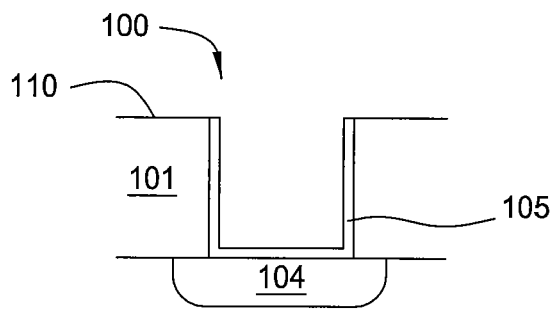

FIG. 1B shows optional barrier layer 105 conformally deposited within via 102 over dielectric layer 101. Barrier layer 105 may be deposited by a PVD process or a selective ALD or CVD process. Barrier layer 105 may have a thickness within a range from about 5 Å to about 50 Å, preferably, from about 10 Å to about 30 Å. Barrier layer 105 may contain titanium, titanium nitride, tantalum, tantalum nitride, tungsten, tungsten nitride, silicides thereof, borides thereof, derivatives thereof, or combinations thereof.

In some embodiments, barrier layer 105 may contain multiple layers, such as a bilayer of metallic tantalum and tantalum nitride, a bilayer of metallic titanium and titanium nitride, or a bilayer of metallic tungsten and tungsten nitride. In one example, barrier layer 105 may contain a tantalum/tantalum nitride bilayer or a titanium/titanium nitride bilayer. During a PVD process, barrier layer 105 may contain tantalum nitride and metallic tantalum layers deposited followed by an etching step, or a tantalum nitride layer may be deposited followed by an etching step followed by an additional tantalum deposition step. The subsequent etching step opens the bottom of the feature down to metal feature 104.

Figure 1C:
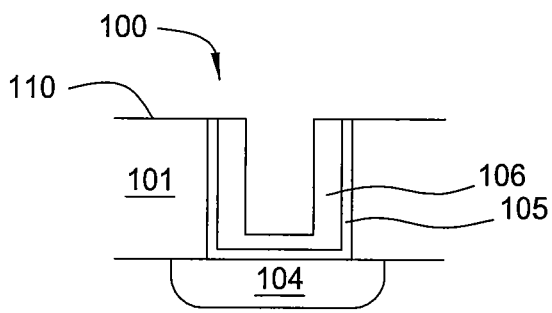

FIG. 1C illustrates copper seed layer 106 deposited on barrier layer 105. Copper seed layer 106 may be deposited by a vapor deposition process, such as ALD, PVD, or CVD or by a liquid process, such as ECP or electroless deposition. In one embodiment, copper seed layer 106 may have a thickness within a range from about 2 Å to about 100 Å. In another embodiment, copper seed layer 106 may have a thickness within a range from about 50 Å to about 1,500 Å. In one example, copper seed layer 106 is deposited by a PVD process. In one example, copper seed layer 106 contains copper or a copper alloy and has a copper-containing surface. Alternatively, copper seed layer 106 may be deposited by alternating a copper containing precursor and a reducing agent during an ALD process.

Figure 1D:
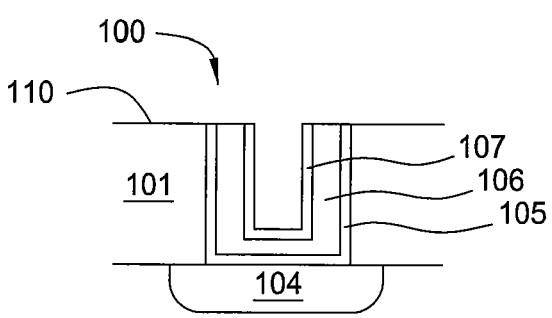

FIG. 1D illustrates ruthenium film 107 selectively deposited on copper seed layer 106. Ruthenium film 107 is intended to lock the grain boundaries of copper seed layer 106 to minimize agglomeration. Accordingly, ruthenium film 107 may be a continuous layer or a discontinuous layer across copper seed layer 106. However, since ruthenium film 107 is selectively deposited on copper seed layer 106, dielectric surface 110 is free or at least substantially free of ruthenium film 107. Ruthenium film 107 may have a thickness of about 100 Å or less, preferably, about 40 Å or less, more preferably, about 20 Å or less, such as about 10 Å or less. In one example, ruthenium film 107 may have a thickness within a range from about 2 Å to about 20 Å.

Ruthenium film 107 may be deposited on copper seed layer 106 by thermal decomposition of a ruthenium precursor contained within a carrier gas. The carrier gas may be argon, nitrogen, hydrogen, or combinations thereof. In one embodiment, the carrier gas may be inert or substantially inert and contain nitrogen gas or argon. In another embodiment, the carrier gas may be a reducing agent, such as hydrogen gas.

The substrate may be heated to a temperature within a range from about 100° C. to about 400° C. during a thermal decomposition process. The ruthenium precursor used during the deposition process may contain at least one ligand that includes cyclopentadienyl, alkylcyclopentadienyl, pentadienyl, alkylpentadienyl, amindinate, carbonyl, pyrrolyl, oxide, derivatives thereof, or combinations thereof. Some exemplary ruthenium precursors include bis(cyclopentadienyl)ruthenium, bis(methylcyclopentadienyl)ruthenium, bis(ethylcyclopentadienyl)ruthenium, bis(dimethylcyclopentadienyl)ruthenium, bis(diethylcyclopentadienyl)ruthenium, bis(methylethylcyclopentadienyl)ruthenium, (methylcyclopentadienyl) (ethylcyclopentadienyl)ruthenium, bis (2,4-dimethylpentadienyl)ruthenium, bis(2,4-diethylpentadienyl) ruthenium, (2,4-dimethylpentadienyl)(cyclopentadienyl)ruthenium, (2,4-dimethylpentadienyl)(methylcyclopentadienyl)ruthenium, (2,4-dimethylpentadienyl) (ethylcyclopentadienyl)ruthenium, or derivatives thereof. In one example, the ruthenium precursor is (methylcyclopentadienyl)(ethylcyclopentadienyl)ruthenium.

In an alternative embodiment, ruthenium film 107 may be deposited by exposing the substrate to the ruthenium precursor gas and a reducing gas or other reagent during an ALD process or a CVD process. Ruthenium materials may be deposited by ALD processes further described in commonly assigned U.S. Pat. No. 7,264,846 and U.S. Ser. No. 10/811,230, filed Mar. 26, 2004, and published as US 2004-0241321, which are herein incorporated by reference.

Figure 1E:
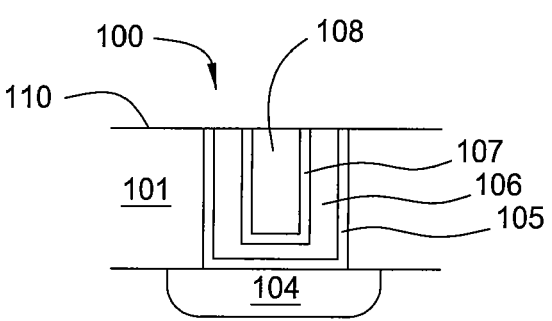

FIG. 1E shows copper bulk layer 108 deposited over ruthenium film 107. In one example, copper bulk layer 108 may be deposited by an ECP process. It is believed that the transition metal layers facilitate the ECP process when the seed layer is thin and/or discontinuous. Ruthenium film 107 may provide a conductive bridge across the surface of substrate 100 to facilitate current distribution across the substrate and across areas where seed layer 106 may be discontinuous. Copper bulk layer 108 may also be deposited by PVD, CVD, electroless deposition, or other deposition methods.

Figure 2A:
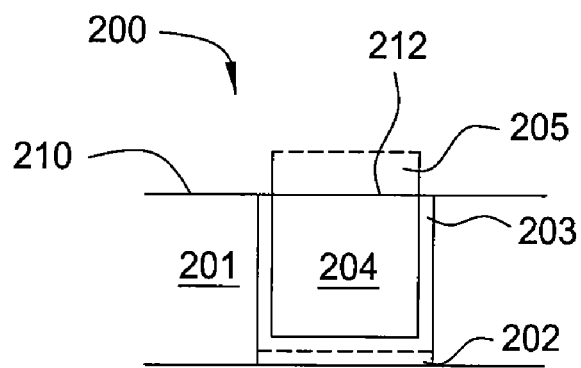
FIGS. 2A-2B depict schematic views of a substrate at different process steps according to another embodiment described herein.
Figure 2B:
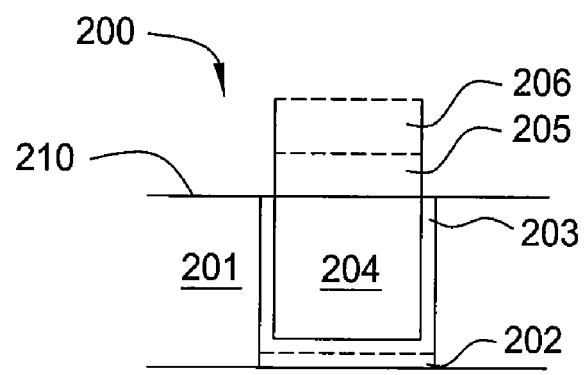

In another embodiment, FIGS. 2A-2B illustrate an additional embodiment utilizing a ruthenium film or layer in a capping layer application deposited on a metal feature such as copper. FIG. 2A illustrates dielectric layer 201 with ruthenium film 202, barrier layer 203 (e.g., tantalum nitride), and copper bulk layer 204 deposited in a feature formed therein on substrate 200. Ruthenium film 202 is optional deposited on substrate 200. The upper surface of substrate 200 has been chemically mechanically polished following copper deposition leaving exposed upper surface 212 of copper bulk layer 204 and dielectric surface 210 of dielectric layer 201. Ruthenium film 205 is selectively deposited on upper surface 212 of copper bulk layer 204 while leaving dielectric surface 210 free or at least substantially free of ruthenium film 205. The ruthenium is preferably deposited on the exposed copper surface or copper bulk layer 204 by thermal decomposition of a ruthenium precursor that may be combined with a carrier gas. The same deposition process for depositing ruthenium film 107 may be used to deposit ruthenium films 202 or 205, including using the same temperatures, ruthenium precursors, carrier gases, and other process variables.

Alternatively, ALD or CVD may be used to deposit the ruthenium. Ruthenium film 205 improves copper adhesion to subsequent capping layers formed thereon. Ruthenium film 205 may act as a capping layer. Alternatively, a separate capping layer or another copper layer may be deposited on ruthenium film 205 as layer 206, depicted in FIG. 2B.

Optionally, a chemical treatment may be used to treat ruthenium film 205 before depositing layer 206. Chemical treatments include exposing the substrate surface to cleaning agents, complexing agents, or other chemicals and rinsing the substrate. As one example, a material such as cobalt tungsten or cobalt tungsten phosphorous may be deposited as layer 206 on ruthenium film 205. In another example, a bulk copper material may be deposited as layer 206 on ruthenium film 205. Layer 206 containing copper may also be deposited by PVD, ECP, electroless deposition, or other deposition methods.

FIG. 2B illustrates layer 206 deposited on top of ruthenium film 205. Layer 206 containing a capping material may be deposited by an electroless process. In an electroless process, the substrate is exposed to a liquid containing the precursors for the capping layer. A capping process that may be used herein which utilizes a ruthenium-containing film in combination with an additional materials is disclosed in commonly assigned, now abandoned U.S. Ser. No. 10/967,099, filed on Oct. 15, 2004, and published as US 2005-0085031, which is incorporated herein by reference.

A low dielectric constant barrier layer such as a silicon carbide based layer and/or a silicon nitride layer may be deposited conformally on ruthenium film 205 or layer 206. An example of a suitable film is a silicon carbide based film formed using CVD or plasma enhanced CVD (PE-CVD) processes such as the processes described in commonly assigned U.S. Pat. Nos. 6,537,733, 6,790,788, and 6,890,850, which are herein incorporated by reference. It is believed that the ruthenium-containing film improves adhesion between subsequently deposited low dielectric constant film, such as a silicon and carbon containing low dielectric constant film, and capping layers. An additional dielectric deposition step may follow the silicon carbide and/or silicon nitride deposition.

While the foregoing is directed to embodiments of the invention, other and further embodiments of the invention may be devised without departing from the basic scope thereof, and the scope thereof is determined by the claims that follow.

The invention claimed is:

1. A method for forming layers on a substrate, comprising:
positioning a substrate within a processing chamber, wherein the substrate comprises a dielectric layer disposed thereon and a via formed within the dielectric layer, the dielectric layer comprises a dielectric surface and the via comprises a copper layer disposed within;
exposing the substrate to a ruthenium precursor comprising at least one ligand to to selectively form a ruthenium-containing film on the copper layer while leaving exposed the dielectric surface during a vapor deposition process; and
depositing a copper bulk layer over the ruthenium-containing film.

2. The method of claim 1, wherein the ruthenium-containing film has a thickness of about 20 Å or less.

3. The method of claim 2, wherein the ruthenium-containing film has a thickness within a range from about 2 Å to about 20 Å.

4. The method of claim 2, wherein the thickness is about 10 Å or less.

5. The method of claim 1, wherein the at least one ligand of the ruthenium precursor is selected from the group consisting of cyclopentadienyl, alkylcyclopentadienyl, pentadienyl, alkylpentadienyl, derivatives thereof, and combinations thereof.

6. The method of claim 5, wherein the substrate is heated to a temperature within a range from about 100° C. to about 400° C. during the vapor deposition process.

7. The method of claim 1, wherein the at least one ligand of the ruthenium precursor is selected from the group consisting of cyclopentadienyl, alkylcyclopentadienyl, pentadienyl, alkylpentadienyl, amindinate, carbonyl, pyrrolyl, derivatives thereof, and combinations thereof.

8. The method of claim 1, wherein the ruthenium precursor comprises a compound selected from the group consisting of bis(cyclopentadienyl)ruthenium, bis(2,4-dimethylcyclopentadienyl)ruthenium, bis(2,4-diethylcyclopentadienyl)ruthenium, bis(methylethylcyclopentadienyl)ruthenium, (methylcyclopentadienyl) (ethylcyclopentadienyl)ruthenium, bis(2,4-dimethylpentadienyl)ruthenium, bis(2,4-diethylpentadienyl)ruthenium, (2,4-dimethylpentadienyl)(cyclopentadienyl)ruthenium, (2,4-dimethylpentadienyl)(methylcyclopentadienyl)ruthenium, (2,4-dimethylpentadienyl)(ethylcyclopentadienyl)ruthenium, derivatives thereof, and combinations thereof.

9. The method of claim 1, wherein the copper layer is a copper seed layer deposited by a physical vapor deposition process.

10. The method of claim 1, wherein the copper bulk layer is deposited by an electrochemical plating process.

11. A method for forming layers on a substrate, comprising:
positioning a substrate within a processing chamber, wherein the substrate comprises a dielectric layer disposed thereon and a via formed within the dielectric layer, the dielectric layer comprises a dielectric surface and the via comprises a copper layer disposed within;

exposing the substrate to a ruthenium precursor comprising an organic ligand to selectively form a ruthenium-containing film on the copper layer while leaving exposed the dielectric surface during a vapor deposition process, wherein the ruthenium precursor reacts with the copper layer to form copper-containing compounds comprising the organic ligand;

removing the copper-containing compounds as a gas from the processing chamber; and depositing a copper bulk layer over the ruthenium-containing film.

12. The method of claim 11, wherein the ruthenium-containing film has a thickness of about 20 Å or less.

13. The method of claim 12, wherein the ruthenium-containing film has a thickness within a range from about 2 Å to about 20 Å.

14. The method of claim 12, wherein the thickness is about 10 Å or less.

15. The method of claim 11, wherein the copper layer is disposed on a barrier layer deposited within the via over the dielectric layer, and the barrier layer comprises at least one material selected from the group consisting of titanium, titanium nitride, tantalum, tantalum nitride, tungsten, tungsten nitride, silicides thereof, borides thereof, derivatives thereof, and combinations thereof.

16. The method of claim 11, wherein the substrate is heated to a temperature within a range from about 100° C. to about 400° C. during the vapor deposition process.

17. The method of claim 11, wherein the organic ligand is selected from the group consisting of cyclopentadienyl, alkylcyclopentadienyl, pentadienyl, alkylpentadienyl, amindinate, carbonyl, pyrrolyl, derivatives thereof, and combinations thereof.

18. The method of claim 11, wherein the ruthenium precursor comprises a compound selected from the group consisting of bis(cyclopentadienyl)ruthenium, bis(2,4-dimethylcyclopentadienyl)ruthenium, bis(2,4-diethylcyclopentadienyl)ruthenium, bis(methylethylcyclopentadienyl)ruthenium, (methylcyclopentadienyl)(ethylcyclopentadienyl)ruthenium, bis(2,4-dimethylpentadienyl)ruthenium, bis(2,4-diethylpentadienyl)ruthenium, (2,4-dimethylpentadienyl)(cyclopentadienyl)ruthenium, (2,4-dimethylpentadienyl)(methylcyclopentadienyl)ruthenium, (2,4-dimethylpentadienyl)(ethylcyclopentadienyl)ruthenium, derivatives thereof, and combinations thereof.

19. The method of claim 11, wherein the copper layer is a copper seed layer deposited by a physical vapor deposition process.

20. The method of claim 11, wherein the copper bulk layer is deposited by an electrochemical plating process.

21. A method for forming layers on a substrate, comprising:

exposing a substrate within a processing chamber to a ruthenium precursor comprising an organic ligand to selectively form a ruthenium-containing film on a copper layer disposed within a via formed within a dielectric layer disposed on the substrate while leaving exposed a dielectric surface of the dielectric layer, wherein the copper layer is disposed on a barrier layer deposited over the dielectric layer within the via, and the ruthenium precursor reacts with the copper layer to form copper-containing compounds comprising the organic ligand;

removing the copper-containing compounds as a gas from the processing chamber; and depositing a copper bulk layer over the ruthenium-containing film.

* * * * *